(12) United States Patent
     Kononchuk

(10) Patent No.: US 10,619,997 B2
(45) Date of Patent: Apr. 14, 2020

(54) METHOD FOR MEASURING THICKNESS VARIATIONS IN A LAYER OF A MULTILAYER SEMICONDUCTOR STRUCTURE

(71) Applicant: Soitec, Bernin (FR)

(72) Inventor: Oleg Kononchuk, Theys (FR)

(73) Assignee: Soitec, Bernin (FR)

( * ) Notice: Subject to any disclaimer, the term of this patent is extended or adjusted under 35 U.S.C. 154(b) by 72 days.

(21) Appl. No.: 15/761,664

(22) PCT Filed: Oct. 3, 2016

(86) PCT No.: PCT/EP2016/073558
§ 371 (c)(1),
(2) Date: Mar. 20, 2018

(87) PCT Pub. No.: WO2017/055624
PCT Pub. Date: Apr. 6, 2017

(65) Prior Publication Data
US 2018/0347966 A1     Dec. 6, 2018

(30) Foreign Application Priority Data

Oct. 2, 2015   (EP) ..................................... 15306552

(51) Int. Cl.
     *G01B 11/06*     (2006.01)
     *H01L 21/66*     (2006.01)
     (Continued)

(52) U.S. Cl.
     CPC ...... *G01B 11/0641* (2013.01); *G01B 11/0633* (2013.01); *G01B 11/30* (2013.01);
     (Continued)

(58) Field of Classification Search
     CPC . G01B 11/30; G01B 11/0633; G01B 11/0625; G01N 2021/8438; G01N 21/8422; H01L 22/12
     See application file for complete search history.

(56) References Cited

U.S. PATENT DOCUMENTS 5,091,647 A    2/1992  Carduner et al.

FOREIGN PATENT DOCUMENTS

CN        1265737 A    9/2000
CN      102456593 A    5/2012
                (Continued)

OTHER PUBLICATIONS

International Search Report for International Application No. PCT/EP2016/073558 dated Dec. 15, 2016, 3 pages.
(Continued)

*Primary Examiner* — Rebecca C Bryant
(74) *Attorney, Agent, or Firm* — TraskBritt

(57) ABSTRACT

A method for measuring thickness variations in a first layer of a semiconductor structure includes: acquiring an image of at least one zone of the surface of the structure, processing the acquired image so as to determine a map of the thickness variations of the first layer, and comparing the intensity of each pixel of the image with a predetermined calibration curve, the calibration curve being determined for a given thickness of a second layer of the structure, and measuring the thickness of the second layer in the at least one zone, -if the measured thickness is different from the thickness of the second layer considered in the calibration curve, using a correction curve to determine a corrected map of thickness variations of the first layer.

18 Claims, 2 Drawing Sheets

(51) Int. Cl.
  *G01B 11/30* (2006.01)
  *H01L 29/06* (2006.01)
  *H01L 29/16* (2006.01)

(52) U.S. Cl.
  CPC .......... *H01L 22/12* (2013.01); *H01L 29/0649* (2013.01); *H01L 29/16* (2013.01)

(56) References Cited

FOREIGN PATENT DOCUMENTS

| | | |
|---|---|---|
| CN | 102414821 B | 4/2014 |
| CN | 104870933 B | 5/2017 |
| EP | 0624775 A1 | 11/1994 |
| JP | 1996-082511 A | 3/1996 |
| JP | 2005-184013 A | 7/2005 |
| JP | 2011-141136 A | 7/2011 |
| JP | 2011-249621 A | 12/2011 |
| JP | 2012-164801 A | 8/2012 |
| JP | 2013-137205 A | 7/2013 |
| WO | 2014072109 A1 | 5/2014 |

OTHER PUBLICATIONS

International Written Opinion for International Application No. PCT/EP2016/073558 dated Dec. 15, 2016, 6 pages.
Katsidis et al., General Transfer-Matrix Method for Optical Multilayer Systems with Coherent, Partially Coherent, and Incoherent Interference, Applied Optics, vol. 41, Issued 19, (2002), pp. 3978-3987 (abstract only).
Chinese Office and Search Report for Chinese Application No. 201680055505.5 dated Jul. 2, 2019, 6 pages.
Japanese Notification of Reason for Rejection for Japanese Application No. 2018-516704 dated Jan. 31, 2020, 3 pages.

METHOD FOR MEASURING THICKNESS VARIATIONS IN A LAYER OF A MULTILAYER SEMICONDUCTOR STRUCTURE

CROSS-REFERENCE TO RELATED APPLICATIONS

This application is a national phase entry under 35 U.S.C. § 371 of International Patent Application PCT/EP2016/073558, filed Oct. 3, 2016, designating the United States of America and published in English as International Patent Publication WO 2017/055624 A1 on Apr. 6, 2017, which claims the benefit under Article 8 of the Patent Cooperation Treaty to European Patent Application Serial No. 15306552.9, filed Oct. 2, 2015.

TECHNICAL FIELD

The present disclosure relates to a method for measuring thickness variations in a layer of a multilayer semiconductor layer, as well as to a system allowing application of the method.

BACKGROUND

In the field of electronics, multilayer semiconductor structures are frequently used.

A particular example of such structures is a structure of the semiconductor-on-insulator (SeOI) type.

A structure of the SeOI type typically comprises from its base to its surface a supporting substrate, an electrically insulating layer and a thin semiconducting layer, called an active layer, in or on which electronic components are generally intended to be formed.

When the thin layer is in silicon, the structure is designated by the term of SOI, an acronym of "Silicon-On-Insulator."

The electrically insulating layer is in a dielectric material, notably an oxide of the material of the supporting substrate and/or of the thin layer. This layer is then usually designated by the term of BOX, acronym of "Buried Oxide."

Recently, SOI structures having an extra-thin layer of silicon have been developed.

These structures are designated by the term of "FDSOI," for "Fully Depleted SOT," i.e., a totally depleted SOT.

By "ultra-thin" is meant a thickness of less than or equal to 50 nm, preferably less than or equal to 12 nm, which may even be reduced down to about 5 nm.

FDSOI structures are particularly advantageous for producing planar electronic components, for example, FDMOS (acronym of "Fully Depleted Metal Oxide Semiconductor") transistors, for which the channel is formed in or on the thin layer of silicon.

Because of the extreme thinness of the thickness of the thin layer, the threshold voltage of the transistor (usually noted as Vt), which depends on this thickness, is very sensitive to thickness variations of the thin layer.

For such applications, optimum uniformity of the thin silicon layer is, therefore, sought so as to have minimum Vt variability from one transistor to the other.

Considering the small dimensions of these devices and their great proximity, it is necessary to measure the thickness variation between points very close to each other, for example, every 0.5 µm.

This implies, during the method for making the SOT, measuring the thickness of the thin silicon layer and of the electrically insulating layer, in different points of the surface of the SOT, in a wide range of spatial wavelengths, typically comprised between 0.5 µm and 300 mm.

Present measurement methods are based on optical measurements, notably ellipsometry or spectral reflectometry.

In both cases, these methods imply conducting a large number of measurements by illuminating the SOT with a light flux having several optical wavelengths, so as to not only measure the thickness of the silicon layer but also that of the buried oxide layer.

However, with these techniques, it is not possible to conduct measurements with spatial wavelengths as small as 0.5 µm.

Thus, an ellipsometer allows measurements to be conducted with spatial wavelengths greater than or equal to about 40 µm.

On the other hand, these measurements take a long time and are a penalty in the manufacturing cycle of the SOIs.

Moreover, measurements conducted by ellipsometry or reflectometry with a single optical wavelength would not give the possibility of determining with sufficient accuracy the thickness of the silicon layer, since, for a given optical wavelength, the measured thickness of the silicon layer depends on the thickness and on the nature of the underlying buried oxide layer.

Document WO 2014/072109 discloses a method for measuring thickness variations in a layer of a multilayer semiconductor structure (typically an SOI, in particular, an FDSOI) intended to conduct measurements, in particular, in the range of spatial wavelengths of between 0.5 and 40 which is not accessible with the above-described measurement methods.

This method comprises:
acquiring, with at least an image acquisition system, at least one image of the surface of the structure, the image being obtained by reflecting a quasi-monochromatic light flux on the surface of the structure,
processing at least one acquired image so as to determine, from intensity variations of the light reflected by the surface, the variations of the thickness of the layer to be measured (typically, the thickness of the superficial silicon layer),
wherein the wavelength of the quasi-monochromatic light flux is selected so as to correspond to a minimum of the sensitivity of the reflectivity of the multilayer structure with respect to a layer of the structure other than the layer for which thickness variations have to be measured.

The sensitivity of the reflectivity with respect to a layer of the structure, which is homogeneous to the reciprocal of a length, is defined as being the ratio between:
the difference between the reflectivities of two multilayer structures for which the considered layer has a given thickness difference from one structure to the other (for example, 0.1 nm) and
the given thickness difference,
the thicknesses of the other layers as for them being identical in both structures.

FIG. 1 illustrates the curves of the sensitivity of the reflectivity (noted as SR, expressed in $Å^{-1}$) of an FDSOI structure versus the wavelength $\lambda$ with non-polarized light calculated relatively to the silicon layer (curves Si1 and Si2) and relatively to the buried oxide layer (curves BOX1 and BOX2), for a thickness variation of the considered layer of 0.1 nm.

In this structure, the silicon layer has a thickness of about 12 nm and the buried oxide layer has a thickness of about 25 nm.

The rectangle in dotted lines appearing on this graph indicates an optimum range of wavelengths for illuminating the structure and for acquiring an image of the reflected light in order to determine the thickness variations in the silicon layer.

Indeed, in this interval, the sensitivity of the reflectivity with respect to the buried oxide layer is, in absolute value, a minimum (curves BOX1 and BOX2 passing through 0).

This means that the reflectivity variation measured with a quasi-monochromatic light flux in this range of wavelengths (being expressed, on an image of the surface, by intensity variations of the pixels) essentially depends on the thickness variations of the silicon curve to be measured.

It is, therefore, possible to determine, from intensity variations of the light reflected by the surface of the structure, the thickness variations of the layer to be measured.

In the illustrated example, the optimum wavelength of the light flux is comprised between about 510 and 530 nm. A quasi-monochromatic interferential filter around 515 nm may, therefore, be selected for forming the incident light flux.

In order to build a map of the thickness variations of the layer, a calibration curve is first computed to establish a relationship between the grey levels of the acquired image and a local thickness of the layer to be measured.

An example of such a calibration curve is shown in FIG. 2.

The computation of such a curve requires:
- on the one hand, measuring (e.g., by ellipsometry) the thickness of the silicon layer of several FDSOI structures corresponding to given product specifications (such specifications typically comprise a target thickness of the silicon layer, e.g., 12 nm, and a target thickness of the buried oxide layer, e.g., 25 nm);
- on the other hand, acquiring images of zones of the surface of each of the structures with a quasi-monochromatic incident flux having a given wavelength, and measuring the intensity of the pixels of the images.

It is thus possible to associate a determined thickness of the silicon layer with a corresponding grey level in the image.

The measurement points allow constructing a theoretical curve (c) that comprises, in abscissa, the grey levels GS (arbitrary unit), and in ordinate, the thickness t of the superficial silicon layer (angstroms).

This calibration curve is then used during inspection of each structure corresponding to the product specifications for which the curve has been computed.

During inspection of a structure, a zone of the surface of the structure is illuminated with the above-mentioned quasi-monochromatic light flux and an image of the light flux reflected by the zone is acquired.

The intensity of the pixels of the image is measured and, thanks to the above-mentioned calibration curve, the thickness of the silicon layer in this zone is deduced.

However, for an FDSOI structure corresponding to a product with given specifications, the thickness of the buried oxide layer is also likely to vary within the same structure and/or from one structure to another one.

As shown in FIG. 1, a thickness variation of the buried oxide layer corresponds to a different wavelength to be applied, which, in turn, induces a variation of the reflectivity of the silicon layer and thus uncertainty on the real thickness of the thickness of the layer.

Such uncertainty is considered to range from 10% to 15% for an FDSOI structure corresponding to given product specifications.

The users of FDSOI structures now have increasingly stringent requirements regarding the accuracy of the mapping of the thickness variations and it thus becomes necessary to reduce the measurement error so as to reach an error of 1% or less.

To improve the situation, one possibility would be to determine, for each measurement zone, a specific wavelength corresponding to the minimum of the sensitivity of the reflectivity for the respective thickness of the buried oxide layer, and to use a quasi-monochromatic light flux having the specific wavelength to illuminate the structure in this zone.

However, such a solution is not practical on an industrial scale since it would require a high number of filters to obtain the quasi-monochromatic light flux with the desired wavelength.

BRIEF SUMMARY

A goal of the disclosure is to define a method for measuring thickness variations in a layer of a multi-layer semiconductor structure, which allows reducing the measurement error while being compatible with an industrial implementation, in particular, allowing using a quasi-monochromatic light flux having the same wavelength for all structures corresponding to the same product specifications.

To that end, an object of the disclosure is a method for measuring thickness variations in a first layer of a multilayer semiconductor structure, comprising:
- acquiring, with an image acquisition system, an image of at least one zone of the surface of the structure, the image being obtained by reflecting a quasi-monochromatic light flux on the zone of the surface of the structure,
- processing the acquired image so as to determine, from intensity variations of the light reflected by the zone of the surface, a map of the thickness variations of the first layer, the treatment comprising comparing the intensity of each pixel of the image with a predetermined calibration curve defining a relationship between the intensity of a pixel of the acquired image and a local thickness of the first layer, the calibration curve being determined for a given thickness of a second layer of the structure different from the first layer,
- wherein the wavelength of the quasi-monochromatic light flux is selected so as to correspond to a minimum of the sensitivity of the reflectivity with respect to the second layer,
- the method being characterized in that it further comprises:
- measuring, in particular, by ellipsometry, the thickness of the second layer in the at least one zone of the surface of the structure,
- if the measured thickness is different from the thickness of the second layer considered in the calibration curve, applying a correction curve to the map of the thickness variations, wherein the correction curve defines, for the measured thickness of the second layer, a relationship between a thickness of the first layer and a correction factor to apply to the map of the thickness variations of the first layer, so as to determine a corrected map of thickness variations of the first layer.

The sensitivity of the reflectivity with respect to a layer of the structure, which is homogeneous to the reciprocal of a length, is defined as being the ratio between:
- the difference between the reflectivities of two multilayer structures for which the considered layer has a given thickness difference from one structure to the other (for example, 0.1 nm) and
- the given thickness difference,
- the thicknesses of the other layers as for them being identical in both structures.

In other words, both structures targeted above consist of the same layers, the layers having the same thickness in both structures except for the layer for which the sensitivity of the reflectivity is to be measured and to which is assigned a thickness that differs from one structure to the other.

This sensitivity of the reflectivity depends on the wavelength of the light flux used for the measurement.

For the application of the disclosure, the absolute value of the sensitivity is of interest, the minimum sought sensitivity relatively to a layer other than the layer to be measured being zero or close to zero.

By a "multilayer structure," is meant a structure comprising at least two layers that are transparent at the wavelength of the quasi-monochromatic measurement flux.

By "quasi-monochromatic" is meant a light flux for which the spectrum extends in a range of wavelengths, which may extend up to +/−20 nm relatively to a rated wavelength. When the wavelength of the quasi-monochromatic flux is referred to, reference is made to the rated wavelength. Naturally, a monochromatic light flux, i.e., having a single wavelength, may also be used for applying the present disclosure.

According to an embodiment, the image acquisition system is an optical microscope.

According to another embodiment, the image acquisition system is a digital camera configured to acquire an image wherein the size of a pixel is less than or equal to 0.25 μm.

Advantageously, the numerical aperture of the image acquisition system is greater than or equal to 0.8.

The incidence of the light flux on the surface of the structure is preferably normal to the surface.

According to an embodiment, the multilayer structure is a structure consisting of two layers transparent to the wavelength of the quasi-monochromatic light flux on a supporting substrate.

In particular, the multilayer structure may be a semiconductor-on-insulator structure comprising a supporting substrate, an electrically insulating layer and a semiconducting layer, and the layer for which the thickness variations are measured is the semiconducting layer.

According to an advantageous embodiment, the structure is an FDSOI structure, the layer for which the thickness variations are measured being a silicon layer having a thickness of less than or equal to 50 nm, preferably less than or equal to 12 nm.

According to an embodiment, images of a plurality of zones of the surface of the structure are acquired and the quasi-monochromatic light flux has the same wavelength for each zone.

The method may also be implemented on a plurality of semiconductor structures, wherein the quasi-monochromatic light flux has the same wavelength for each structure.

Another object relates to a measurement system allowing the implementation of the method described above.

The system comprises:
- a device for illuminating the structure, adapted for emitting a quasi-monochromatic light flux toward the surface of the structure, wherein the wavelength of the light flux corresponds to a minimum of the sensitivity of the reflectivity with respect to a second layer of the structure different from the first layer, the sensitivity of the reflectivity with respect to a layer being equal to the ratio between:
  (i) the difference between the reflectivities of two multilayer structures for which the considered layer has a given thickness difference, and
  (ii) the given thickness difference,
  the thicknesses of the other layers being identical in both multilayer structures,
- an image acquisition system laid out so as to acquire at least one image of a zone of the surface of the structure by reflection of the quasi-monochromatic light flux,
- a device for measuring, in particular, by ellipsometry, the thickness of the second layer to be measured in at least one zone of the surface of the structure,
- a memory wherein a calibration curve defining a relationship between intensity of a pixel in the acquired image and a local thickness of the first layer is stored, the calibration curve being determined for a given thickness of the second layer,
- a processing system configured for, from the at least one acquired image, determining from the intensity variations of the light reflected by the surface, a map of the variations of the thickness of the first layer by comparing the intensity of each pixel of the acquired image with the calibration curve,
- a computation system configured to receive thickness measurement data from the measuring device and for, if the measured thickness is different from the thickness of the second layer considered in the calibration curve, applying a correction curve to the map of the thickness variations, wherein the correction curve defines, for the measured thickness of the second layer, a relationship between a thickness of the first layer and a correction factor to apply to the map of the thickness variations of the first layer, so as to determine a corrected map of thickness variations of the first layer.

BRIEF DESCRIPTION OF THE DRAWINGS

Other features and advantages of the disclosure will become apparent from the detailed description that follows, with reference to the accompanying drawings wherein.

DETAILED DESCRIPTION

Figure 3:
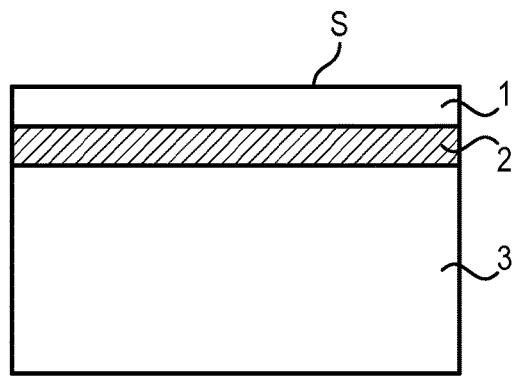
FIG. 3 is a cross-sectional view of a multilayer structure, for which an attempt is made for measuring the thickness variations of one of the layers.

FIG. 3 illustrates a multilayer structure for which the thickness variations of one of the layers are to be measured.

The structure successively comprises from its surface S to its base a first layer 1, a second layer 2 and a supporting substrate 3.

The first and second layers are in selected materials so as to be transparent at the measurement wavelength, i.e., the incident light flux is able to cross each of the layers and be partly reflected on the surface of the underlying layer.

Generally, the semiconducting materials and the dielectric materials have this property, provided that they have a sufficiently thin thickness, i.e., typically less than 500 nm.

A very fine metal layer (i.e., having a thickness of less than 200 nm) may also be applied in such a multilayer structure.

The person skilled in the art is able to determine, for materials customarily used in the field of electronics, the maximum thicknesses for which they are transparent to a given wavelength.

The supporting substrate, on the other hand, plays a role of a mechanical support and is generally too thick (typically a few hundred μm) so as to be transparent to the measurement wavelength.

The supporting substrate may be bulk or else consists of a plurality of layers of different materials.

In the example illustrated in FIG. 3, the structure is, therefore, a bilayer structure, the supporting structure not being considered as a layer, the thickness variations of which may be measured.

Nevertheless, the present disclosure is not limited to such a structure but may also apply to a structure comprising three layers transparent to the measurement wavelength, or even more.

According to an advantageous application of the present disclosure, the structure is a structure of the semiconductor-on-insulator type, in which the supporting substrate is the substrate 3, the electrically insulating layer is the buried layer 2, and the semiconductor layer is the surface layer 1.

According to an embodiment, the layer for which thickness variations are measured is the surface semiconductor layer 1.

In the particular case of an FDSOI structure, the layer for which the thickness variations are measured is the surface layer 1, which is a silicon layer having a thickness of less than or equal to 50 nm, preferably less than or equal to 12 nm.

The principle of the measurement, based on the reflections occurring in both layers of the multilayer structure is described in document WO 2014/072109 (see, in particular, FIG. 2 and the corresponding description) and will thus not be repeated here.

The sensitivity of the reflectivity relative to a layer corresponds to the partial derivative of the reflectivity curve relative to the thickness of the considered layer, the outer layers of the structure having a fixed thickness.

For example, for a structure of the SOI type as illustrated in FIG. 3, the sensitivity of the reflectivity is calculated with respect to the semiconductor layer 1 by setting the thickness of the buried oxide layer 2 and by determining the reflectivity of the structure for two different thicknesses of the semiconductor layer 1, the difference between both of these thicknesses, for example, being 0.1 nm.

For the same structure, the sensitivity of the reflectivity is defined relative to the buried oxide layer 2 by setting the thickness of the semiconductor layer 1 and by determining the reflectivity of the structure for two different thicknesses of the buried oxide layer 2, the difference between both of these thicknesses, for example, being 0.1 nm.

In the case of a stack of three layers transparent to the measurement wavelength, the person skilled in the art is able to determine on this same principle the Fresnel coefficients.

Notably, in the case when the structure comprises a surface layer, the thickness variations of which are to be determined, and two underlying transparent layers, it is possible to assimilate both of these layers to a single layer having a reflectivity and sensitivity that may be calculated from those of the two layers.

Advantageously, the incident flux on the surface S of the structure is normal to the latter, this configuration simplifying subsequent processing of the image.

However, it is possible, by way of additional processing within the competence of one skilled in the art, to make use of an image acquired by reflection of a light flux not normal to the surface of the structure.

For acquiring at least one image of a zone of the surface, various image acquisition systems may be used.

Preferably, the numerical aperture of the acquisition system is of at least 0.8.

According to an embodiment of the disclosure, the acquisition system comprises an optical microscope having a reflection mode, i.e., allowing illumination of the multilayer structure through its surface S to be observed. The system further comprises a sensor able to acquire an image of a zone of the surface as seen by the microscope.

According to another embodiment of the disclosure, the acquisition system comprises a digital camera and allows direct acquisition of an image of a zone of the surface of the structure on which is reflected the incident light flux.

In order that the resolution of such a device is sufficient, it is considered that the size of the pixels should be less than or equal to 0.25 μm. In other words, a pixel of the device should correspond to an area with a side of 0.25 μm or less on the surface of the structure.

The microscope and the camera give the possibility of obtaining spatial wavelengths up to 0.5 μm, which allows sufficiently fine determination of the thickness variations on the surface of the structure.

The images acquired by the acquisition system are typically black and white images having different grey levels.

The acquisition system is calibrated so as to have each grey level (intensity of each pixel) correspond with a corresponding thickness of the layer to be measured.

As explained above, from several structures corresponding to the same product specifications, images of the surface are acquired by reflection of the quasi-monochromatic light flux and, on these same structures, a measurement by ellipsometry of the layer is conducted, for which the thickness variations are to be measured. The zones of the structure subjected to imaging and ellipsometry are the same; in other words, the size and position of the zone for which an image is acquired are the same as the zone onto which ellipsometry is carried out.

Figure 1:
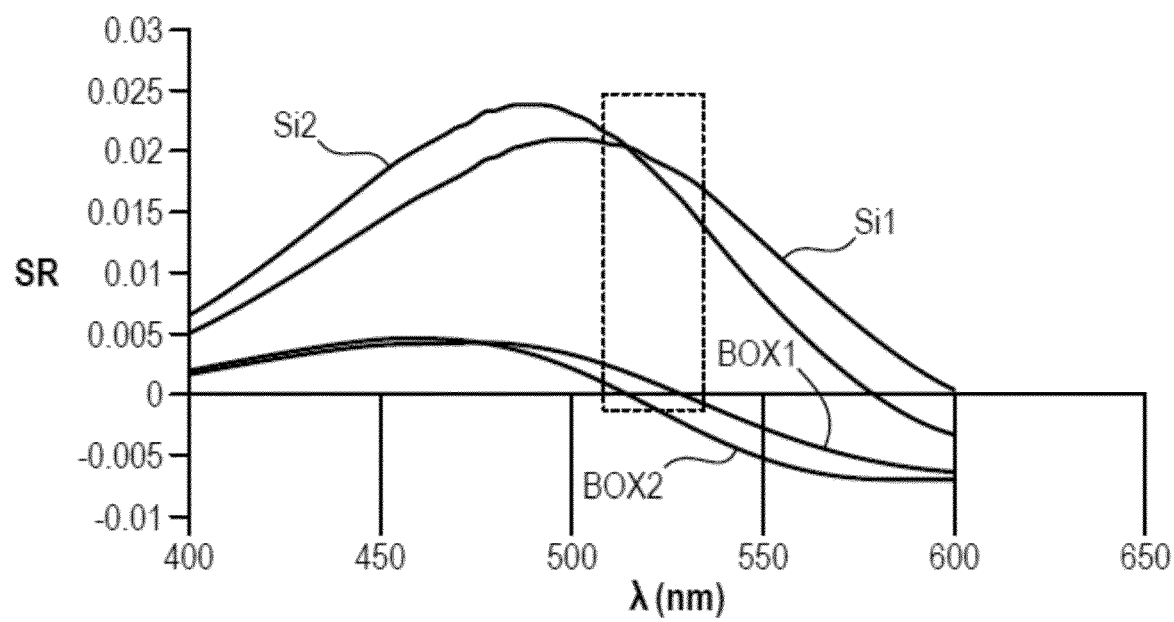
FIG. 1 shows the curves of the sensitivity of the reflectivity of an FDSOI structure, versus the wavelength, relative to the thin silicon layer (curves Si1 and Si2) and relative to the buried oxide layer (curves BOX1 and BOX2)
Figure 2:
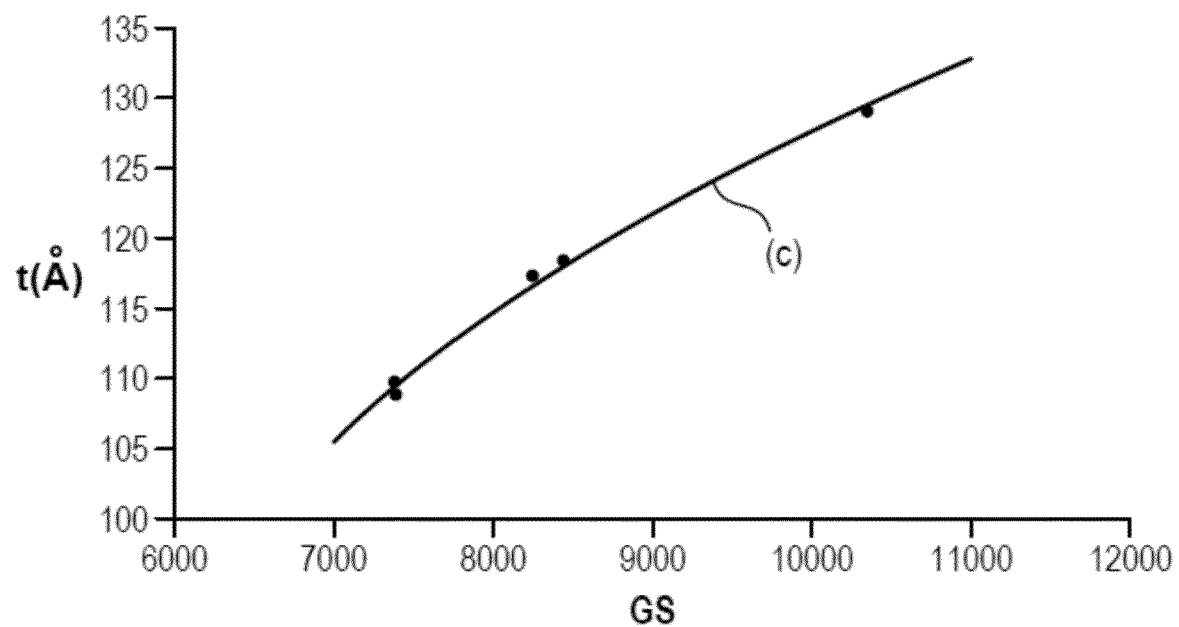
FIG. 2 shows a calibration curve of an optical microscope used in the method described in document WO 2014/072109.

A calibration curve of the type of the one illustrated in FIG. 2 is thereby obtained, which shows the thicknesses measured by ellipsometry versus the grey levels of the acquired image. In this figure, the grey levels correspond to an arbitrary scale.

In order to build the curve (c) of FIG. 2, the thickness of the silicon layer of five FDSOI structures, for which the silicon layer had a thickness comprised between 11 and 13 nm, was measured by ellipsometry. Moreover, images of the surface of these structures were acquired with an incident quasi-monochromatic light flux of 540 nm and the intensity of the pixels of these images was measured. It was thus possible to associate a determined thickness with the corresponding grey level on the image. The measurement points were then used as a basis for defining the theoretical curve (c).

Based on the calibration curve, it is possible to produce from the intensity of the different pixels of an image, a mapping of the thickness of the layer for which the thickness variations are to be measured. This is done by comparing the intensity of each pixel of the image with a predetermined calibration curve defining a relationship between the intensity of a pixel of the acquired image and a local thickness of the first layer. Thus, for each pixel of the image, a corresponding local thickness is associated.

The calibration curve is computed for a given thickness of the other layer than the layer to be measured. For example, the calibration curve shown in FIG. 2 has been computed considering that the thickness of the buried oxide layer is 25 nm.

In order to take into account possible variations in the thickness of the buried oxide layer, a correction curve corresponding to a thickness different from the thickness considered in the product specifications is computed.

Figure 4:
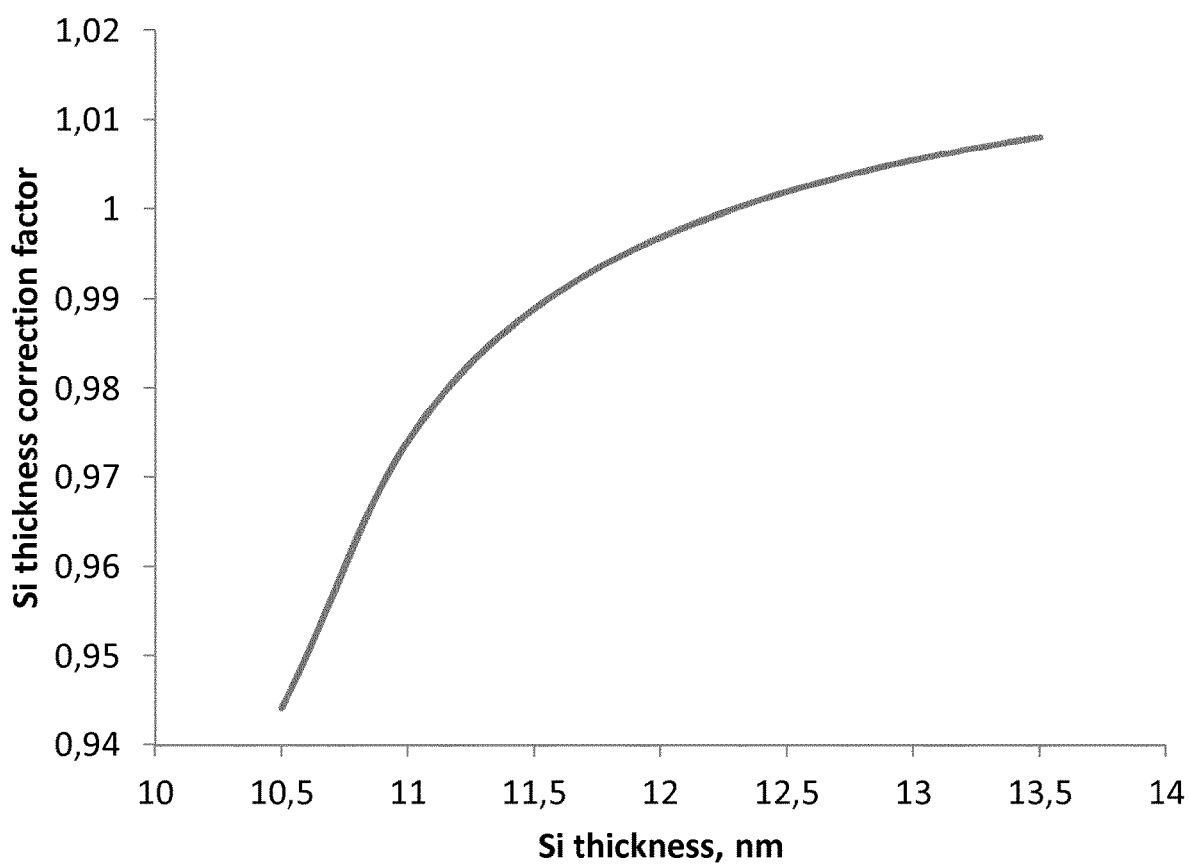
FIG. 4 shows a correction curve to be applied to the thickness map in accordance with the disclosure.

An example of such a correction curve is shown in FIG. 4. This curve establishes, for a given thickness of the buried oxide layer 2 (e.g., 24 nm), a relationship between the thickness of the silicon layer 1 (abscissa, nm) and a correction factor (ordinate, no unit) to be applied to the thickness map of the silicon layer 1 to obtain the real thickness.

The correction curve is obtained as follows.

For each structure, measurement of the thickness of the silicon layer and of the buried oxide layer is carried out by ellipsometry or reflectometry. The measurement is done in a zone that is the same (in terms of size and position) as the zone for which an image is acquired. For example, if the image of the surface acquired through a microscope is 80 μm×80 μm, the beam of the ellipsometer has the same size as this image and is directed to the same zone of the surface of the structure. Theoretical calculations based on a transfer matrix method for optical multilayer structures (see, for example, C. C. Katsidis and D. I. Siapkas, "General transfer-matrix method for optical multilayer systems with coherent, partially coherent and incoherent interference," *Appl. Opt.* vol. 41, pp. 3978-3987, 2002) allow determining, for the measured thickness of the BOX layer, a relationship between the real thickness of the silicon layer and the thickness measured from the grey levels of the image. This relationship is represented in the form of the correction curve of FIG. 4.

The correction curve is applied to the map of thickness variations of the silicon layer that has been obtained using the calibration curve. The correction is done, for each point of the map, by multiplying the respective thickness by the suitable correction factor given by the correction curve. The result of this multiplication is a corrected map of thickness variations that is more accurate than the previously determined map.

When images of several zones of the surface of the structure are acquired, a correction curve is computed for each zone using the method described above.

Since ellipsometry and/or reflectometry are usually available in test rooms for SOI structures in order to carry out various measurements on the structures, the specific measurement described above is easy to implement and does not alter the efficiency of the testing process, even if carried out onto each structure for which thickness variations are sought and possibly on several zones of the structure.

The use of a specific correction curve allows using the same wavelength for generating the thickness mapping for all the structures corresponding to the same product specifications, since it allows taking into account the thickness variations of the other layer.

The measurement system for this purpose comprises a processing system configured so as to determine on an acquired image, from intensity variations of the light reflected by the surface, the variations of the thickness of the layer to be measured.

The processing system may thus comprise a computer provided with a microprocessor and a memory in which is recorded a program that may be executed by the microprocessor and containing instructions for applying the aforementioned computation steps.

The processing system may further comprise a screen for displaying a map of the thickness variations of the layer to be measured.

Moreover, the measurement system further comprises an illumination device capable of generating a quasi-monochromatic light flux with the wavelength considered to be optimal for the corresponding product specifications, i.e., a wavelength corresponding to a minimum of the sensitivity of the reflectivity with respect to a layer of the structure other than the layer for which the thickness variations have to be measured.

Advantageously, the processing system described above is itself configured in order to simulate the optical response of a multilayer structure and to automatically select the wavelength of the adequate quasi-monochromatic light flux. For this purpose, the measurement system further comprises an ellipsometer or reflectometer, which is used for conventionally measuring the thickness of each of the layers of the structure from the reflectivity of the layers.

Alternatively or additionally, the measurement system comprises a graphic interface on which a user inputs the characteristics of the relevant structure (material and thickness of the different layers). By knowing these thicknesses, the processing system applies a simulation of the sensitivity of the reflectivity relative to each of the layers of the structure depending on the wavelength of an illumination light flux and infers therefrom a range of wavelengths in which the sensitivity of the reflectivity with respect to the layer(s) of the structure other than the layer for which measurements of the thickness variations are to be obtained, is in absolute value, a minimum.

Finally, it is obvious that the examples that have just been given are only particular, and by no means limiting, illustrations as to the fields of application of the disclosure. Notably, if the disclosure advantageously applies to the measurement of thickness variations of a structure of the FDSOI type, it is not limited to such a structure but also applies to any multilayer structure comprising at least two layers transparent to the quasi-monochromatic light flux used for the measurement.

REFERENCES

WO 2014/072109.
C. C. Katsidis and D. I. Siapkas, "General transfer-matrix method for optical multilayer systems with coherent, partially coherent and incoherent interference," *Appl. Opt.* vol. 41, pp. 3978-3987, 2002.

The invention claimed is:
1. A method for measuring thickness variations in a first layer of a multilayer semiconductor structure, comprising:
   acquiring, with an image acquisition system, an image of at least one zone of the surface of the structure, the image being obtained by reflecting a quasi-monochromatic light flux the at least one zone of the surface of the structure, processing the acquired image so as to determine, from intensity variations of the light reflected by the at least one zone of the surface, a map of the thickness variations of the first layer, the processing comprising comparing the intensity of each pixel of the image with a predetermined calibration curve defining a relationship between the intensity of a pixel of the acquired image and a local thickness of the first layer, the calibration curve being based on a given thickness of a second layer of the structure different from the first layer, wherein the wavelength of the quasi-monochromatic light flux is selected so as to correspond to a minimum of the sensitivity of the reflectivity with respect to the second layer, the sensitivity of the reflectivity being equal to the ratio between:

(i) the difference between the reflectivities of a first multilayer structure and a second multilayer structure, the first multilayer structure comprising the first layer and the second layer, wherein the second layer has a first thickness, the second multilayer structure comprising the first layer and the second layer, wherein the second layer has a second thickness different from the first thickness, and (ii) the difference between the first thickness and the second thickness, the thicknesses of the other layers other than the second layer being identical in the two multilayer structures, measuring, in particular by ellipsometry, the thickness of the second layer in the at least one zone of the surface of the structure, if the measured thickness is different from the thickness of the second layer considered in the calibration curve, applying a correction curve to the map of the thickness variations, wherein the correction curve defines, for the measured thickness of the second layer, a relationship between a thickness of the first layer and a correction factor to apply to the map of the thickness variations of the first layer, so as to determine a corrected map of thickness variations of the first layer.

2. The method of claim 1, wherein the image acquisition system is an optical microscope.

3. The method of claim 1, wherein the image acquisition system is a digital camera configured to acquire an image and wherein the size of a pixel of the image is less than or equal to 0.25 µm.

4. The method of claim 3, wherein the numerical aperture of the image acquisition system is greater than or equal to 0.8.

5. The method of claim 4, wherein the incidence of the light flux on the surface of the structure is normal to the surface.

6. The method of claim 5, wherein the multilayer structure is a structure consisting of two layers transparent to the wavelength of the quasi-monochromatic light flux on a supporting substrate.

7. The method of claim 6, wherein the multilayer structure is a semiconductor-on-insulator structure comprising a supporting substrate, an electrically insulating layer and a semiconducting layer, and wherein the layer for which the thickness variations are measured is the semiconducting layer.

8. The method of claim 7, wherein the structure is an FDSOI structure, the layer for which the thickness variations are measured being a silicon layer having a thickness of less than or equal to 50 nm.

9. The method of claim 8, wherein images of a plurality of zones of the surface of the structure are acquired, and wherein the quasi-monochromatic light flux has the same wavelength for each zone.

10. The method of claim 9, wherein the method is implemented on a plurality of semiconductor structures, the quasi-monochromatic light flux having the same wavelength for each structure.

11. A system for measuring thickness variations in a first layer of a multilayer semiconductor structure, comprising:

a device for illuminating the structure, adapted for emitting a quasi-monochromatic light flux towards the surface of the structure, wherein the wavelength of the light flux corresponds to a minimum of the sensitivity of the reflectivity with respect to a second layer of the structure different from the first layer, the sensitivity of the reflectivity with respect to a layer being equal to the ratio between:

the difference between the reflectivities of a first multilayer structure and a second multilayer structure, the first multilayer structure comprising the first layer and the second layer, wherein the second layer has a first thickness, the second multilayer structure comprising the first layer and the second layer, wherein the second layer has a second thickness different from the first thickness, and (ii) the difference between the first thickness and the second thickness, the thicknesses of the other layers other than the second layer being identical in both multilayer structures, an image acquisition system laid out so as to acquire at least one image of a zone of the surface of the structure by reflection of the quasi-monochromatic light flux, a device for measuring, in particular by ellipsometry, the thickness of the second layer to be measured in the at least one zone of the surface of the structure, a memory wherein a calibration curve defining a relationship between intensity of a pixel in the acquired image and a local thickness of the first layer is stored, the calibration curve being determined for a given thickness of the second layer, a processing system configured for, from the acquired image, determining from the intensity variations of the light reflected by the surface, a map of the variations of the thickness of the first layer by comparing the intensity of each pixel of the acquired image with the calibration curve, a computation system configured to receive thickness measurement data from the measuring device and for, if the measured thickness is different from the thickness of the second layer considered in the calibration curve, applying a correction curve to the map of the thickness variations, wherein the correction curve defines, for the measured thickness of the second layer, a relationship between a thickness of the first layer and a correction factor to apply to the map of the thickness variations of the first layer, so as to determine a corrected map of thickness variations of the first layer.

12. The method of claim 1, wherein the numerical aperture of the image acquisition system is greater than or equal to 0.8.

13. The method of claim 1, wherein the incidence of the light flux on the surface of the structure is normal to the surface.

14. The method of claim 1, wherein the multilayer structure is a structure consisting of two layers transparent to the wavelength of the quasi-monochromatic light flux on a supporting substrate.

15. The method of claim 1, wherein the multilayer structure is a semiconductor-on-insulator structure comprising a supporting substrate, an electrically insulating layer and a semiconducting layer, and wherein the layer for which the thickness variations are measured is the semiconducting layer.

16. The method of claim 8, wherein the structure is an FDSOI structure, the layer for which the thickness variations are measured being a silicon layer having a thickness of less than or equal to 12 nm.

17. The method of claim 1, wherein images of a plurality of zones of the surface of the structure are acquired, and wherein the quasi-monochromatic light flux has the same wavelength for each zone.

18. The method of claim 1, wherein the method is implemented on a plurality of semiconductor structures, the quasi-monochromatic light flux having the same wavelength for each structure.

* * * * *

UNITED STATES PATENT AND TRADEMARK OFFICE
CERTIFICATE OF CORRECTION

PATENT NO. : 10,619,997 B2
APPLICATION NO. : 15/761664
DATED : April 14, 2020
INVENTOR(S) : Oleg Kononchuk Page 1 of 1

It is certified that error appears in the above-identified patent and that said Letters Patent is hereby corrected as shown below:

In the Specification

| | | |
|---|---|---|
| Column 1, | Line 46, | change ""Fully Depleted SOT,"" to --"Fully Depleted SOI,"-- |
| Column 1, | Line 66, | change "making the SOT," to --making the SOI,-- |
| Column 2, | Line 2, | change "the SOT, in" to --the SOI, in-- |
| Column 2, | Line 7, | change "the SOT with" to --the SOI with-- |
| Column 2, | Line 31, | change "0.5 and 40" to --0.5 and 40 μm-- |

Signed and Sealed this
Twenty-sixth Day of May, 2020

Andrei Iancu
*Director of the United States Patent and Trademark Office*